(12) United States Patent
Jenkins, IV

(10) Patent No.: US 7,251,168 B1
(45) Date of Patent: Jul. 31, 2007

(54) INTERFACE FOR ACCESS TO NON-VOLATILE MEMORY ON AN INTEGRATED CIRCUIT

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 194 days.

(21) Appl. No.: 11/048,332

(22) Filed: Feb. 1, 2005

(51) Int. Cl.
*G11C 7/10* (2006.01)
*H03K 19/173* (2006.01)

(52) U.S. Cl. .......................... 365/189.01; 365/189.03; 365/185.01; 326/38; 326/39

(58) Field of Classification Search ........... 365/185.01, 365/185.08, 185.33; 326/39
See application file for complete search history.

(56) References Cited

U.S. PATENT DOCUMENTS 6,578,104 B1 * 6/2003 Small et al. ................ 711/104
7,046,544 B1 * 5/2006 Shimanek ................... 365/154

* cited by examiner

*Primary Examiner*—Vibol Tan
(74) *Attorney, Agent, or Firm*—LeRoy D. Maunu; Kim Kanzaki

(57) ABSTRACT

An integrated circuit (IC) includes volatile memories, at least one non-volatile memory, at least one control circuit, and a configurable logic array. Each volatile memory has an associated interface including a respective first input and a respective second input. The control circuit is coupled to the volatile memories and the non-volatile memory. The control circuit stores respective contents from each volatile memory in the non-volatile memory responsive to the respective first input, and loads the respective contents into each volatile memory from the non-volatile memory responsive to the respective second input. The configurable logic array is coupled to the volatile memories and is configurable to control each first input and each second input.

19 Claims, 4 Drawing Sheets

INTERFACE FOR ACCESS TO NON-VOLATILE MEMORY ON AN INTEGRATED CIRCUIT

FIELD OF THE INVENTION

The present invention generally relates to integrated circuits (ICs), and more particularly to ICs that include non-volatile memory.

BACKGROUND

A programmable logic device (PLD) that includes non-volatile memory may retain data without power. The data retained in the non-volatile memory may be used for various purposes. A portion of the retained data may be configuration data used to program the logic and routing resources of the PLD to perform a specific function. In addition, a portion of the retained data may be accessible by the programmed device. The retained data may also include operating state of the configured function preserved during power-down of the PLD.

Generally a specific protocol is required to be implemented in the configured function to gain access to the retained data in the non-volatile memory. Reformatting of the retained data may further be required to enable application reading and writing of the retained data. A developer of an application for a PLD may devote significant effort in implementing the specific protocol and the data reformatting in the configured function. That effort may discourage development of applications using retained data from a non-volatile memory included in the PLD.

The present invention may address one or more of the above issues.

SUMMARY OF THE INVENTION

The various embodiments of the invention provide an integrated circuit (IC), which can in one embodiment be a programmable logic device (PLD), that includes volatile memories, at least one non-volatile memory, at least one control circuit, and a configurable logic array. Each volatile memory has an associated interface including a respective first input and a respective second input. The control circuit is coupled to the volatile memories and the non-volatile memory. The control circuit stores respective contents from each volatile memory in the non-volatile memory responsive to the respective first input, and loads the respective contents into each volatile memory from the non-volatile memory responsive to the respective second input. The configurable logic array is coupled to the volatile memories and is configurable to control each first input and each second input. The configurable logic array includes configurable logic resources and configurable routing resources.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In various embodiments of the invention, a PLD is programmed to perform an application function and the PLD includes non-volatile memory that may be used to retain data for the application function despite the interruption of power delivery to the PLD. The application data to be retained is stored by the application function in a memory, which is generally a volatile memory, and the application function generates an update control that causes the application data to be transferred from the volatile memory and stored in the non-volatile memory. Subsequently, for example, following interruption of power to the PLD, the application function generates a reload control that causes the application data previously stored to be transferred from the non-volatile memory and restored in the volatile memory. Then the application function may again access the application data in the volatile memory.

The non-volatile memory may also contain configuration data used to program the PLD to perform the application function. On restoring power delivery to the PLD following an interruption of power delivery to the PLD, a reset of the PLD may automatically program the PLD with the configuration data from the non-volatile memory to restore the application function.

The retention of application data may be accomplished using the volatile memory interface, which is likely already known to a developer of the application function, augmented with the inputs of the update control and the reload control.

Figure 1:
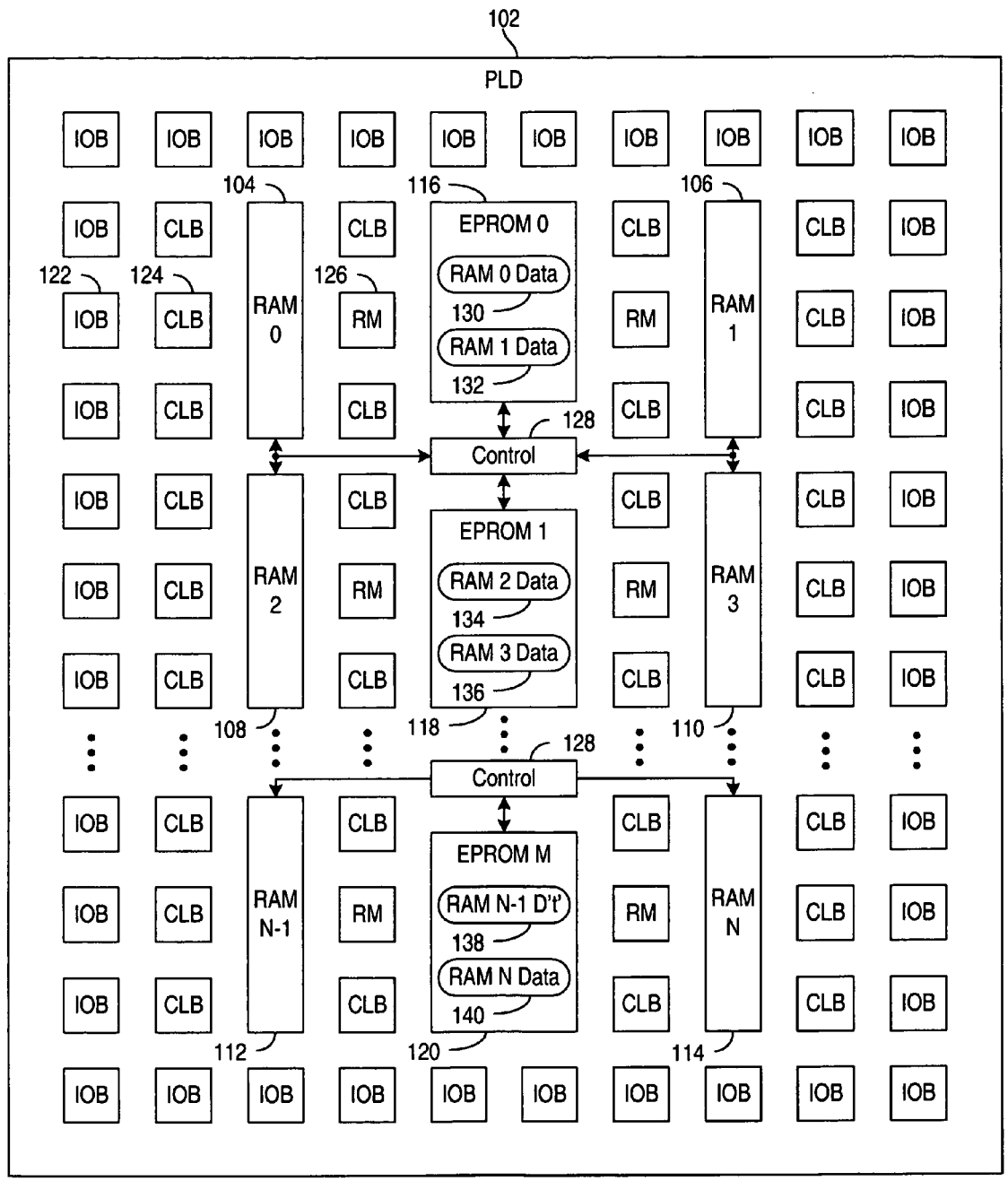
FIG. 1 is a block diagram of a PLD including memories coupled to non-volatile memories, according to various embodiments of the invention.

FIG. 1 is a block diagram of a PLD 102 including memories 104, 106, 108, 110, 112, and 114 coupled to non-volatile memories 116, 118, and 120, according to various embodiments of the invention. The PLD 102 may also include configurable input/output blocks 122, configurable logic blocks 124, configurable routing matrices 126, and memory control blocks 128.

Each memory 104 through 114 may be static random access memory (SRAM) that is distributed across a portion of the PLD 102 or that is localized to a contiguous block in the PLD 102. The memories 104 through 114 are generally volatile memories that do not retain data when power delivery to the PLD 102 is interrupted. On commencing power delivery to the PLD 102, the contents of memories 104 through 114 may be cleared by the PLD 102.

Each non-volatile memory 116, 118, and 120 may be, for example, erasable programmable read-only memory (EPROM) including flash EPROM. Non-volatile memories 116, 118, and 120 generally retain data when power delivery to PLD 102 is interrupted.

While power is supplied to PLD 102, the contents of one or more of memories 104 through 114 may be transferred to non-volatile memories 116 through 120 via the control blocks 128. Each memory 104 through 114 may be coupled to a non-volatile memory of non-volatile memories 116, 118, and 120. For example, memories 104 and 106 may be coupled to non-volatile memory 116, memories 108 and 110 may be coupled to non-volatile memory 118, and memories 112 and 114 may be coupled to non-volatile memory 120. During power delivery to PLD 102, memory data 130 and 132 for non-volatile memory 116, memory data 134 and 136 for non-volatile memory 118, and memory data 138 and 140 for non-volatile memory 120 may each be updated from memory 104, 106, 108, 110, 112, and 114, respectively. During power delivery to PLD 102, memories 104, 106, 108, 110, 112, and 114 may be reloaded with memory data 130, 132, 134, 136, 138, and 140, respectively.

If power delivery to PLD 102 is interrupted after updating memory data 130 through 140 from memories 104 through 114, memories 104 through 114 generally do not retain data while non-volatile memories 116 through 120 do retain memory data 130 through 140. Subsequent to restoring power delivery to PLD 102, the prior contents of memories 104 through 114 may be restored from memory data 130 through 140, respectively.

Figure 2:
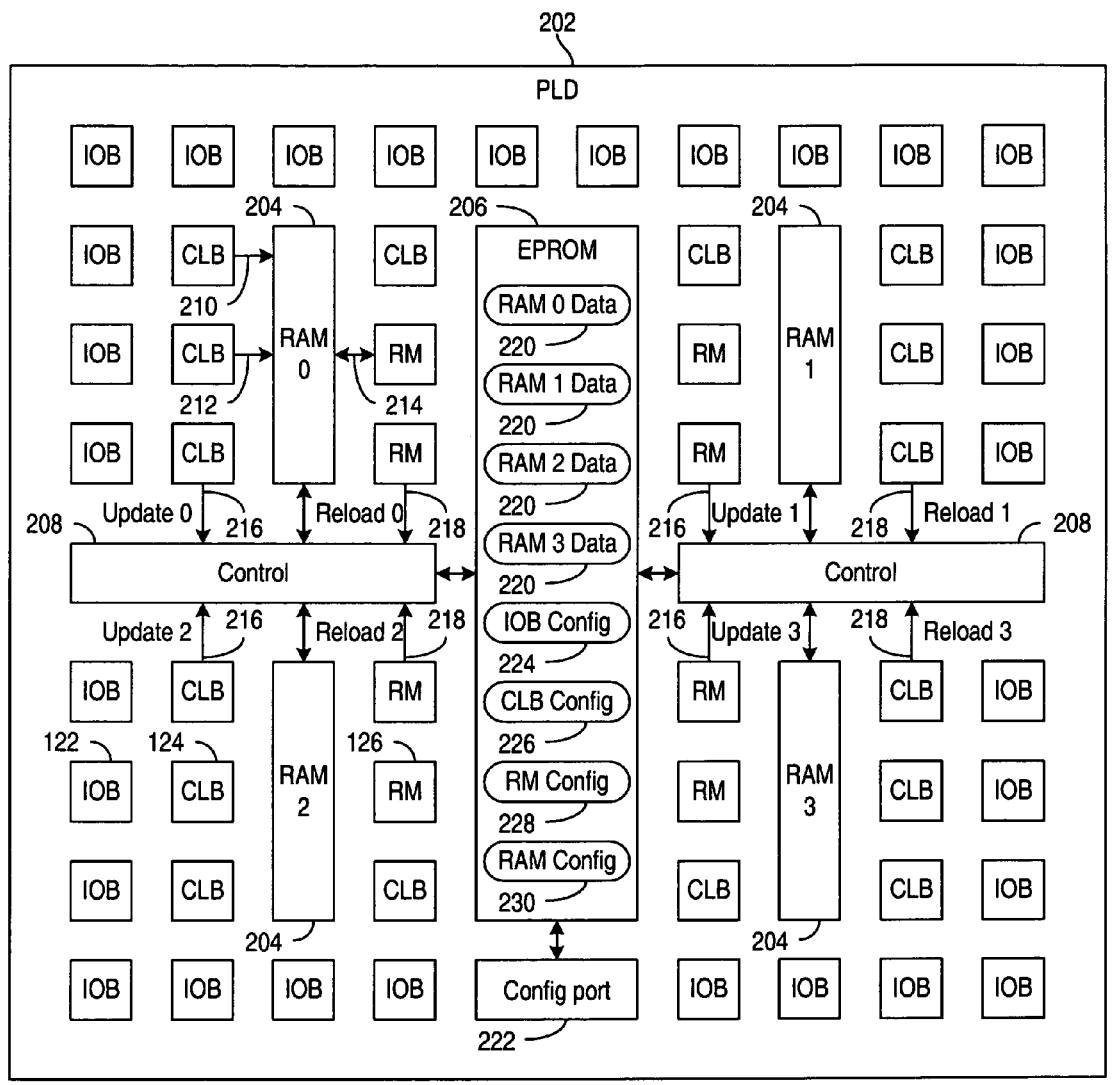
FIG. 2 is a block diagram of a PLD including memories coupled to a non-volatile memory, according to various embodiments of the invention.

FIG. 2 is a block diagram of a PLD 202 including memories 204 coupled to a non-volatile memory 206, according to various embodiments of the invention. The PLD 202 may also include configurable input/output blocks (IOB) 122, configurable logic blocks (CLB) 124, configurable routing matrices (RM) 126, and memory control blocks 208.

The configurable blocks 122, 124, and 126 of PLD 202 may be programmed to implement the logic for an application function. Memories 204 may provide data storage for the application function. The application function may access the storage of memories 204 from certain configurable blocks 124 and 126 with a control bus on line 210, an address bus on line 212, and a data bus on line 214.

Control blocks 208 may transfer data between the memories 204 and the non-volatile memory 206. It will be appreciated that there may be only one control block coupled to each of the memories 204 or more than two control blocks. The control blocks 208 may have respective inputs of update signals on lines 216 and reload signals on lines 218 for each memory 204. The update and reload input signals on lines 216 and 218 may be controlled by certain configurable blocks 124 and 126. An asserted update signal on line 216 for a control block 208 may cause the control block 208 to update a corresponding memory data 220 in non-volatile memory 206 with the current contents of the corresponding memory 204. An asserted reload signal on line 218 for a control block 208 may cause the control block 208 to transfer a corresponding memory data 220 to the corresponding memory 204.

An application needing to preserve data may store the data in a memory 204 by writing the data to the memory 204 using lines 210, 212, and 214, and subsequently transfer the data to the non-volatile memory 206 by asserting the appropriate update signal on line 216. The application may transfer data to non-volatile memory 206 for various purposes, for example, to preserve the data through an expected interruption of power delivery to PLD 202, to repeatedly save data that needs to be preserved through a possible unexpected interruption of power delivery to PLD 202, or to use non-volatile memory 206 to extend the storage capacity of PLD 202. The application may transfer the data from the non-volatile memory 206 to the memory 204 by asserting the appropriate reload signal on line 218, and then read the data from the memory 204 using lines 210, 212, and 214. The application may transfer the data from the non-volatile memory 206 to obtain access to the data, for example, to obtain access to the data after restoration of power delivery to PLD 202.

The PLD 202 may also include a configuration port 222 that may permit an external device to read and write the contents of non-volatile memory 206. Typically, the contents of non-volatile memory 206 are written once from an external source via the configuration port 222 during programming of PLD 202 for the manufacture of a system. However, the contents of non-volatile memory may be rewritten, possibly repeatedly, via the configuration port 222 during development of the application function or to fix discovered defects in the manufactured system. In one embodiment, the configuration port 222 includes the function of the control blocks 208.

The non-volatile memory 206 may contain memory data 220 for each memory 204 and configuration data including IOB configuration data 224, CLB configuration data 226, RM configuration data 228, and memory configuration data 230. The application logic of an application function may be specified by the configuration data 224, 226, 228, and 230. A reset of PLD 202, such as may occur during power-up of PLD 202, may initialize PLD 202 to perform the application function by automatically transferring the configuration data 224, 226, 228, and 230 from the non-volatile memory 206 to configuration registers or configuration SRAM associated respectively with the IOB 122, CLB 124, RM 126, and memories 204.

The values of the configuration registers or configuration SRAM associated with each block 122, 124, 126, and 204 may determine the function of the block. Thus, on reset of the PLD 202, the application function may be automatically restored and the application may also restore to the memories 204 the memory data 220 that was previously saved by the application. In one embodiment, memories 204 are automatically initialized with memory data 220 on reset of PLD 202, and this memory data 220 may be either data previously saved by the application or data written to non-volatile memory 206 via configuration port 222 during programming of PLD 202.

The memory configuration data 230 may configure the operation of each memory 204. For example, each memory 204 may be configurable to provide either synchronous or asynchronous interfaces on lines 210, 212, and 214, and to adjust the width and depth of the memory 204. The memory configuration data 230 configures the operation of each memory 204 while the memory data 220 may provide a value for each bit of the contents of each memory 204. The memory configuration data 230, including the width and depth adjustment, permits the memory data 220 to be reformatted to match the requirements of the application function.

The memories 204, the configurable logic of configurable blocks 122, 124, and 126, and other blocks of PLD 202 may be arranged in PLD 202 as an array of blocks, such that the configurable blocks 122, 124, and 126 are arranged as a configurable logic array.

In one embodiment, the non-volatile memory 206 is partitioned into sectors with a sector for each memory data 220 and one or more sectors for the configuration data 224, 226, 228, and 230. Typically, there are multiple sectors for the configuration data 224, 226, 228, and 230, with each sector containing a portion of the IOB configuration data 224, the CLB configuration data 226, the RM configuration data 228, and the memory configuration data 230.

Figure 3:
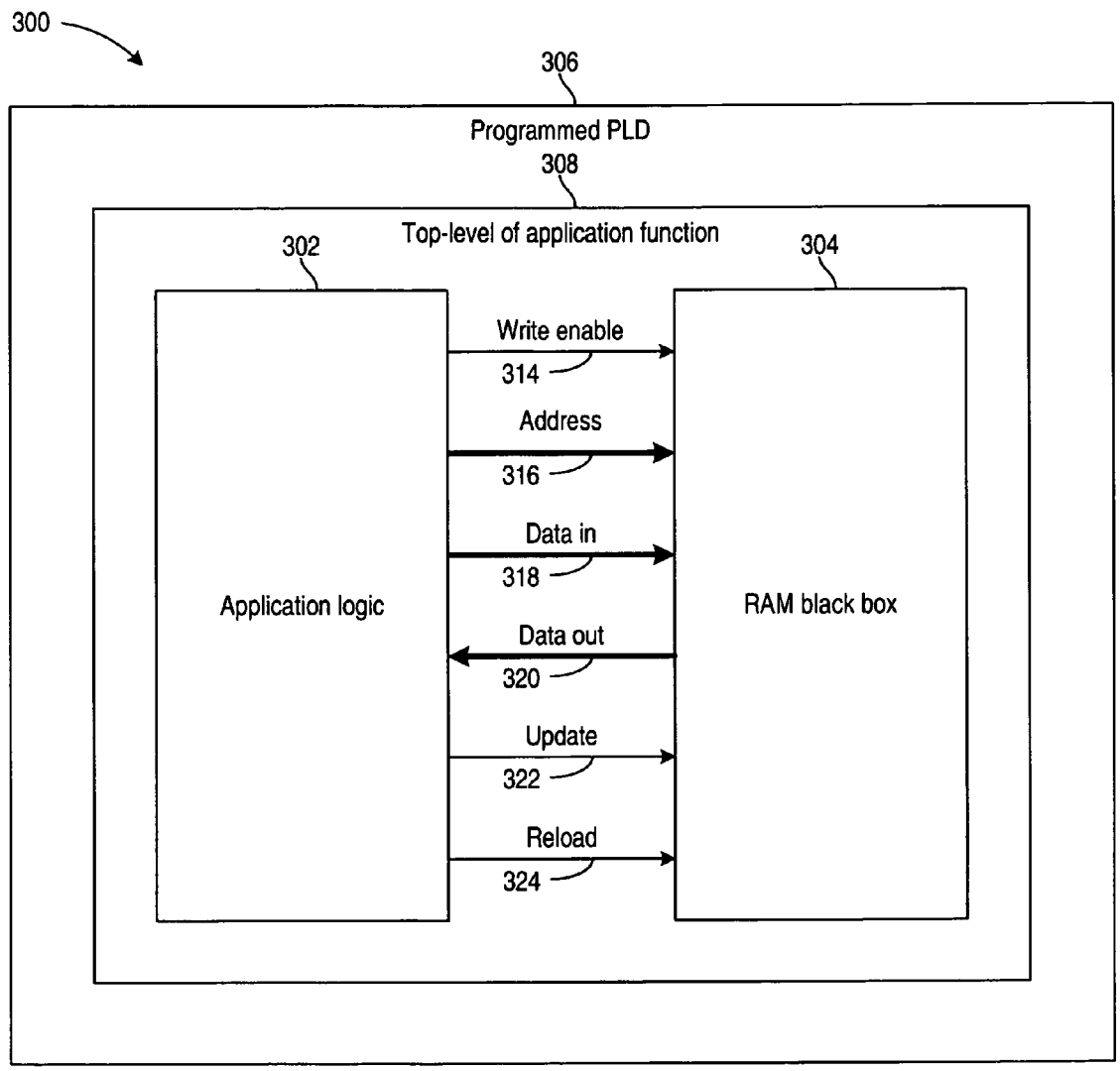
FIG. 3 is a block diagram of an example with application logic interfacing to a memory supporting update to a non-volatile memory and reload from the non-volatile memory, according to various embodiments of the invention.

FIG. 3 is a block diagram 300 of an example with application logic 302 interfacing to a memory 304 supporting update to a non-volatile memory and reload from the non-volatile memory, according to various embodiments of the invention. The block diagram 300 does not show the structure of the PLD 306, but instead shows the structure of the application function 308 that PLD 306 is configured to perform by programming PLD 306 with configuration data corresponding to the application function 308.

The application function 308 in a PLD 306 includes the application logic 302 and a black box representation of the memory 304. The black box representation of the memory 304 presents an abstraction of the memory 304. In certain PLD-application development environments, a black box such as memory black box 304 may be required to be located at the top level of a hierarchy for the application function 308. The memory black box 304 may have parameters to specify configurable features of the memory, such as synchronous or asynchronous interfaces and the width and depth of the memory 304. The black box representation of the memory 304 may represent a single memory block, such as Xilinx block RAM, or multiple memory blocks, such as memory blocks 104 through 114 of FIG. 1, or memories included in a number of configurable logic blocks 122, 124, and 126 of FIG. 2 distributed across PLD 202.

The memory black box 304 may have a control input of write enable on line 314. When write enable on line 314 is asserted, the memory black box 304 may be written at the address on line 316 with the value of data-in bus on line 318. The data-out bus on line 320 may provide the value from memory black box 304 at the address on line 316, regardless of the value of write enable on line 314. It will be appreciated that the memory black box 304 may have alternate configurations including a clock input for a synchronous interface and multiple access ports.

Various embodiments of the invention may add the control inputs of the update signal on line 322 and the reload signal on line 324 to the interface of memory black box 304. When the application logic 302 asserts the update signal on line 322, the current contents of the memory black box 304 are saved in a non-volatile memory. When the application logic 302 asserts the reload signal on line 324, the contents of memory black box 304 are overwritten with retained data from the non-volatile memory. The retained data used to overwrite the contents of memory black box 304 when the application logic 302 asserts the reload signal on line 324 may be either the prior contents of the memory black box 304 at a prior assertion of the update signal on line 322 by the application logic 302, or the original contents of the non-volatile memory if the application logic 302 did not previously assert the update signal on line 322.

Application logic 302 may retain the data in memory black box 304 through an interruption of power delivery to PLD 306 by asserting update on line 322 before the interruption of power delivery and asserting reload on line 324 after the interruption of power delivery.

Figure 4:
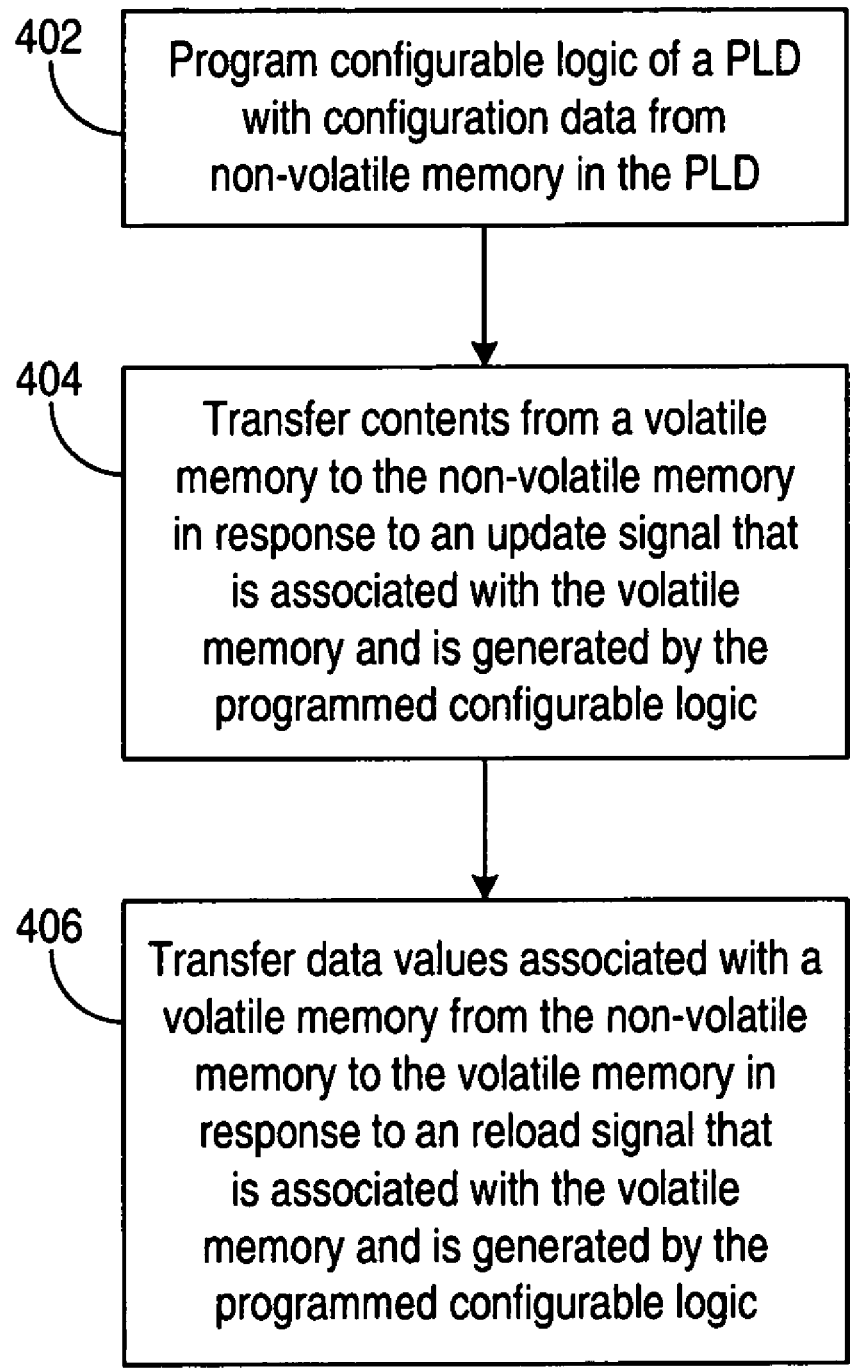
FIG. 4 is a flow diagram of a process for updating a non-volatile memory with the contents from a memory and later reloading the contents from the non-volatile memory to the memory.

FIG. 4 is a flow diagram of a process for updating a non-volatile memory with the contents from a memory and later reloading the contents from the non-volatile memory to the memory.

At step 402, a PLD is programmed to perform an application function that generates update and corresponding reload signals in response to application-specific operating conditions. Each update signal and corresponding reload signal is associated with one of the volatile memories in the PLD that implements the volatile storage. Each update signal controls storing the contents of the associated volatile storage in non-volatile storage, with the non-volatile storage including one or more non-volatile memories. Each corresponding reload signal controls restoring the contents of the associated volatile storage from the non-volatile storage.

At step 404, for each asserted update signal the contents of the associated volatile storage is saved in the non-volatile storage. At step 406, for each asserted reload signal the contents of the associated volatile storage is restored from the non-volatile storage.

The present invention is thought to be applicable to a variety of systems for moving data between volatile and non-volatile memories in PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated Circuit (IC) comprising,
a plurality of volatile memories, each volatile memory having an associated interface including a respective first input and a respective second input;
at least one non-volatile memory;
at least one control circuit coupled to the plurality of volatile memories and coupled to the at least one non-volatile memory, the at least one control circuit adapted to store respective contents from each volatile memory in the at least one non-volatile memory responsive to the respective first input, and load the respective contents into each volatile memory from the at least one non-volatile memory responsive to the respective second input; and
a configurable logic array coupled to the plurality of volatile memories and configurable to control each first input and each second input, wherein the configurable logic array includes configurable logic resources and configurable routing resources.

2. The IC of claim 1, wherein following an interruption of power delivery to the IC data of each volatile memory is not retained and data of the at least one non-volatile memory is retained.

3. The IC of claim 1, wherein each volatile memory is static random access memory (SRAM).

4. The IC of claim 1, wherein each volatile memory includes at least one memory block of the IC.

5. The IC of claim 1, wherein each volatile memory is distributed amongst a plurality of configurable blocks of the IC.

6. The IC of claim 1, wherein each volatile memory is adapted to have a configurable width and a configurable depth.

7. The IC of claim 1, wherein the at least one non-volatile memory is erasable programmable read only memory (EPROM).

8. The IC of claim 7, wherein the EPROM is flash EPROM.

9. The IC of claim 1, wherein the configurable logic array is arranged to permit access to the respective contents of each volatile memory.

10. The IC of claim 1, further comprising a configuration port coupled to the at least one non-volatile memory and adapted to provide off-IC access to the at least one non-volatile memory.

11. The IC of claim 10, wherein the configuration port is adapted to write the at least one non-volatile memory with configuration data from off-IC.

12. The IC of claim 11, wherein the configurable logic array is arranged to be automatically initialized with the configuration data from the at least one non-volatile memory responsive to a reset of the IC.

13. The IC of claim 12, wherein the configurable logic array includes static random access memory (SRAM), and the configurable logic array is arranged to be automatically initialized with the configuration data from the at least one non-volatile memory responsive to the reset of the IC by loading the configuration data into the SRAM.

14. The IC of claim 12, wherein each volatile memory is arranged to be automatically initialized with the respective contents from the at least one non-volatile memory responsive to the reset of the IC.

15. The IC of claim 12, wherein each volatile memory is arranged to be automatically initialized with respective contents from the at least one non-volatile memory responsive to the reset of the IC, wherein the programming of the IC from the external device further includes writing the respective contents to the contents of the at least one non-volatile memory.

16. A method for operating a programmable logic device (PLD), comprising:
  programming configurable logic in the PLD with configuration data from at least one non-volatile memory in the PLD;
  transferring contents of one of a plurality of volatile memories in the PLD to the at least one non-volatile memory in the PLD in response to a respective update signal associated with the one of the plurality of volatile memories and generated by the programmed configurable logic; and
  transferring data values associated with one of the plurality of volatile memories from the at least one non-volatile memory to the one of the plurality of volatile memories in response to a respective reload signal associated with the one of the plurality of volatile memories and generated by the programmed configurable logic.

17. The method of claim 16, further comprising:
  writing the configuration data to the at least one non-volatile memory; and
  transferring the configuration data from the at least one non-volatile memory to the configurable logic in response to resetting of the PLD.

18. The method of claim 16, further comprising interrupting power to the PLD, wherein following the interrupting of the power the volatile memory does not retain the contents and the non-volatile memory does retain the data values.

19. A system for programming an integrated circuit (IC), comprising:
  means for programming configurable logic in the IC with configuration data from at least one non-volatile memory in the IC;
  means for transferring contents of one of a plurality of volatile memories in the IC to the at least one non-volatile memory in the IC in response to a respective update signal associated with the one of the plurality of volatile memories and generated by the programmed configurable logic; and
  means for transferring data values associated with one of the plurality of volatile memories from the at least one non-volatile memory to the one of the plurality of volatile memories in response to a respective reload signal associated with the one of the plurality of volatile memories and generated by the programmed configurable logic.

* * * * *